(12) United States Patent
Chien et al.

(10) Patent No.: US 6,812,502 B1
(45) Date of Patent: Nov. 2, 2004

(54) FLIP-CHIP LIGHT-EMITTING DEVICE

(75) Inventors: Fen-Ren Chien, Yungho (TW); Schang-Jing Hon, Chungho (TW)

(73) Assignee: Uni Light Technology Incorporation, Taoyuan Hisen (TW)

( * ) Notice: Subject to any disclaimer, the term of this patent is extended or adjusted under 35 U.S.C. 154(b) by 0 days.

(21) Appl. No.: 09/434,318

(22) Filed: Nov. 4, 1999

(Under 37 CFR 1.47)

(51) Int. Cl.[7] .............................................. H01L 33/00
(52) U.S. Cl. ............................ 257/99; 257/81; 257/778
(58) Field of Search ......................... 257/99, 94, 754, 257/748, 101, 102, 103, 81, 82, 88, 778; 438/26, 28, 35, 108

(56) References Cited

U.S. PATENT DOCUMENTS

| | | | |
|---|---|---|---|
| 4,396,929 A | 8/1983 | Ohki et al. | 357/17 |
| 4,476,620 A | 10/1984 | Ohki et al. | 29/569.1 |
| 5,557,115 A * | 9/1996 | Shakuda | 257/81 |
| 5,563,422 A | 10/1996 | Nakamura et al. | 257/13 |
| 5,578,839 A | 11/1996 | Nakamura et al. | 257/96 |
| 5,583,879 A | 12/1996 | Yamazaki et al. | 372/45 |
| 5,990,500 A * | 11/1999 | Okazaki | 257/99 |
| 5,998,810 A * | 12/1999 | Hatano et al. | 257/102 |
| 6,100,103 A * | 8/2000 | Shim et al. | 438/26 |
| 6,130,446 A * | 10/2000 | Takeuchi et al. | 257/99 |
| 6,169,363 B1 * | 1/2001 | Mori et al. | 313/582 |

FOREIGN PATENT DOCUMENTS

JP 3-263878 * 11/1991

* cited by examiner

*Primary Examiner*—Phat X. Cao
*Assistant Examiner*—Theresa T. Doan
(74) *Attorney, Agent, or Firm*—Jenkens & Gilchrist, P.C.

(57) ABSTRACT

The present invention discloses a flip-chip light-emitting device that has improved light-emitting efficiency. The device according to the present invention has an electrode with good reflectivity of light, such that the light directed to the base can be reflected by the electrode to the outside, and thus substantially increase the light-emitting efficiency. In addition, said electrode of the present invention also provide better current spreading effect, and thus further increase the light-emitting efficiency of the light-emitting diode.

14 Claims, 3 Drawing Sheets

FLIP-CHIP LIGHT-EMITTING DEVICE

FIELD OF THE INVENTION

The present invention relates to a gallium nitride (GaN)-based light-emitting device and, particularly, to a GaN-based light-emitting device having an electrode with good reflectivity of light.

BACKGROUND OF THE INVENTION

GaN-based light-emitting devices are getting more attention for the reason that they can emit special frequencies of light, such as blue light and green light. The material of substrate used for GaN-based light emitting devices is limited by the property of GaN and is mainly chosen from the following material: sapphire, silicon carbide (SiC), gallium nitride (GaN), gallium phosphide (GaP) and glass. Among the above material, sapphire substrate is widely used. Since sapphire substrate is an insulator, the two electrodes of the light-emitting device must be placed on the same side of the GaN layers. It is the characteristic of so-called lateral devices. U.S. Pat. No. 5,563,422, U.S. Pat. No. 5,578,839 and U.S. Pat. No. 5,583,879 have disclosed a series of methods for manufacturing GaN-based III-V Group compound semiconductor lateral light-emitting devices using sapphire substrate. The light-emitting device manufactured therefrom is shown in FIG. 1, wherein an light-emitting diode (LED) die 10 is fixed to a lead frame 12 first, and the two electrodes 13 and 14 on the upper surface of the die 10 must be soldered with gold (or aluminum) wires 15 and 16 respectively so as to be connected to the two electrode of the lead frame. However, the soldering pad 17 on the upper surface of the die 10 will block the light, and thus the light-emitting area is reduced and the light emitted is not uniform. In addition, in the prior light-emitting device, a light-transmitting electrode 13 is disclosed for providing the effect of current spreading to enhance the light-emitting efficiency of the device. However, since the electrode 13 must be very thin to become light-transmitting, its lateral resistance will be great and thus its effect of current spreading will be very limited. Besides, since the electrode 13 is placed over the main light-emitting surface, even the electrode 13 is light-transmissive, it still will reduce the light-emitting efficiency of the device.

U.S. Pat. No. 4,476,620 discloses a flip-chip GaN-based light-emitting device as shown in FIG. 2, wherein the two electrodes 21 and 22 of an LED die are directly stuck on certain places of a lead frame 23. In such a flip-chip GaN-based light-emitting device, the emitted light can directly pass through the transparent substrate (such as a sapphire substrate) to the outside. There is no soldering pad in the main light-emitting surface of the flip-chip light-emitting device, and thus the light-emitting surface as well as the light-emitting efficiency will not be affected by the soldering pad. However, only about half the light emitted from the prior flip-chip GaN-based light-emitting device can directly pass through the transparent substrate to the outside. The other half of the light is directed to the electrodes (21 and 22) and the lead frame 23. Therefore, the prior device cannot achieve an effective result. Furthermore, the prior flip-chip GaN-based light-emitting device disclosed in U.S. Pat. No. 4,476,620 does not provide the current spreading effect, and thus merely the place where the electrode is located can have an effective light-emitting result while the other place cannot achieve a good light-emitting result.

In view of the above, how to substantially improve the light-emitting efficiency of a GaN-based light-emitting device is still a problem for the industry.

SUMMARY OF THE INVENTION

The main object of the present invention is to substantially improve the light-emitting efficiency of a GaN-based light-emitting device. The light-emitting device according to the present invention is a flip-chip light-emitting device. Therefore, there is no soldering pad in its main light-emitting surface. Additionally, the light-emitting device according to the present invention has an electrode that has good reflectivity of light and can provide effective current spreading effect Therefore, the light directed to the electrode can be reflected by the electrode to the outside through the transparent substrate, and thus substantially increase the light-emitting efficiency of the whole device. Further, the electrode can have sufficient size and thickness to provide effective current spreading effect, such that the light-emitting diode can achieve its best light-emitting result.

A flip-chip light-emitting device according to a first embodiment of the present invention comprises a transparent substrate, a semiconductor stacked structure arranged over a main surface of the transparent substrate wherein the stacked structure comprises an n-type GaN-based III-V Group compound semiconductor layer adjacent to said main surface and a p-type GaN-based III-V Group compound semiconductor layer adjacent to the n-type semiconductor layer, a first electrode being in electrical contact with the n-type semiconductor layer, and a second electrode being in electrical contact with the p-type semiconductor layer, wherein the second electrode has good reflectivity of light and covers most of the outer surface of the p-type semiconductor layer. In an alternative embodiment of the present invention, the positions of the n-type and p-type semiconductor layers are switched, and the electrode being in contact with the n-type semiconductor layer has good reflectivity of light and covers most outer surface of the n-type semiconductor layer.

BRIEF DESCRIPTION OF THE DRAWINGS

The technical content and features of the present invention will be more readily apparent from the following detailed description of the preferred embodiments with reference to the accompanying drawings in which.

DETAILED DESCRIPTION OF THE PREFERRED EMBODIMENTS

The main object of the present invention is to substantially improve the light-emitting efficiency of a GaN-based light-emitting device. The light-emitting device according to the present invention has an electrode that has good reflectivity of light and can provide effective current spreading effect. Therefore, the light directed to the electrode can be reflected by the electrode to the outside, and thus substantially increase the light-emitting efficiency of the whole device. Further, the electrode can have sufficient size and thickness to provide effective current spreading effect, so that the light-emitting diode can achieve its best light-emitting result.

Figure 1:
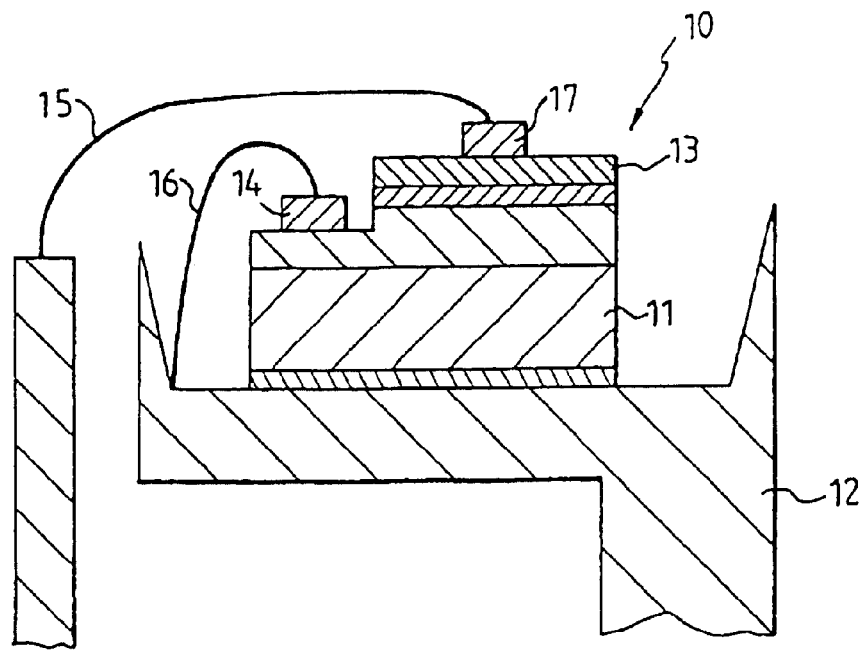
FIG. 1 is a cross-sectional view illustrating a prior GaN-based light-emitting device.
Figure 2:
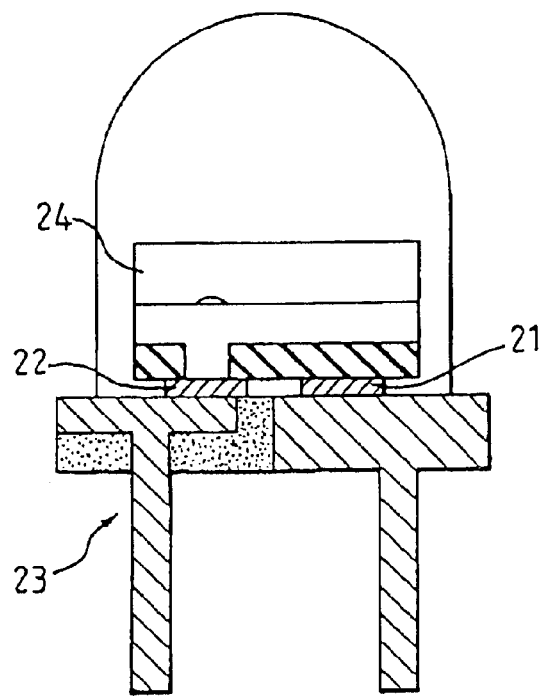
FIG. 2 is a cross-sectional view illustrating a prior flip-chip GaN-based light-emitting device.
Figure 3:
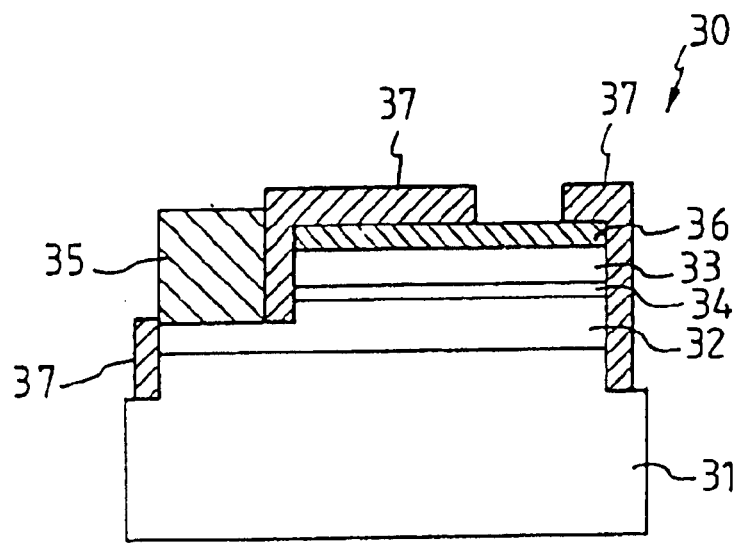
FIG. 3 is a schematic cross-sectional view illustrating a light-emitting diode according to an embodiment of the present invention.

FIG. 3 illustrates a light-emitting diode according to an embodiment of the present invention. The diode structure 30 comprises a transparent substrate 34 which can be made of sapphire, glass, silicon carbide (SiC), gallium nitride (GaN), gallium phosphide (GaP) or other transparent materials. A semiconductor stacked structure is arranged over a main surface of the transparent substrate 34. The stacked structure comprises an n-type GaN-based III-V Group compound semiconductor layer adjacent to said main surface and a p-type GaN-based III-V Group compound semiconductor layer adjacent to the n-type semiconductor layer. In this embodiment, the stacked structure also comprises an active layer 34 placed between the n-type GaN-based III-V Group compound semiconductor layer and the p-type GaN-based III-V Group compound semiconductor layer, while in other embodiments of the present invention, it is possible that the stacked structure does not include the active layer 34. The method for manufacturing the stacked structure is well known in the art, and thus it is unnecessary to detail it here. An electrode 35 is located in a window, that is formed by an etching process, and in electrical contact with the n-type semiconductor layer 32. An electrode 36 is arranged over most of the outer surface of the p-type semiconductor layer 33. Since there are no special limitations on the size and thickness of the electrode 36, the shape and size of the electrode 36 can be designed to achieve the best current spreading result, and thus substantially increase the light-emitting efficiency. In addition, the material of the electrode 36 is chosen to be of high reflectivity of light. Therefore, the light directed to the electrode 36 can be reflected by the electrode 36 to the direction of the transparent substrate, and thus further increase the light-emitting efficiency.

In the present invention, the electrode 36 can be of a multi-layer structure comprising a light-transmitting conductive layer and a layer of aluminium (Al) or silver (Ag). In an embodiment of the present invention, the electrode 36 can be of a nickel/gold/titanium/aluminium (Ni/Au/Ti/Al) multi-layer structure, wherein nickel gold (Ni/Au) is formed to be a light-transmitting metal layer directly covering the p-type semiconductor layer 33, and than a titanium (Ti) layer is formed on the Ni/Au layer, and finally an aluminium (Al) layer is formed on the Ti layer. The electrode 36 is required to be of both low ohmic contact resistance and high reflectivity of light. Ni/Au is one of the materials that can be formed as a good light-transmitting ohmic contact layer for a p-type GaN-based III-V Group compound semiconductor layer. Al layer can be of good reflectivity of light. However, in a high temperature, Al and Au will diffuse into each other and destroy the reflectivity of Al. Therefore a Ti layer is used to be a diffusion barrier between Al and Au. Ti layer itself is also of good reflectivity of light. In other embodiments of the present invention, the electrode 36 can be of a multi-layer structure of ITO Al or ITO Ag, wherein ITO (Indium-Tin Oxide) is formed as a light-transmitting conductive layer and the reflectivity is provided by the Al layer or Ag layer.

In the embodiment shown in FIG. 3, an insulating layer 37 can be coated on the side surface and upper surface of the diode 30 while merely exposing a portion of each electrode that is used to contact the electrode of a base. The material of the insulating layer can be $SiO_N$, $SiN_N$, etc. The insulating layer 37 is to protect and isolate the p/n junction, to avoid short circuit caused by conductive glue and to avoid leakage.

Figure 4:
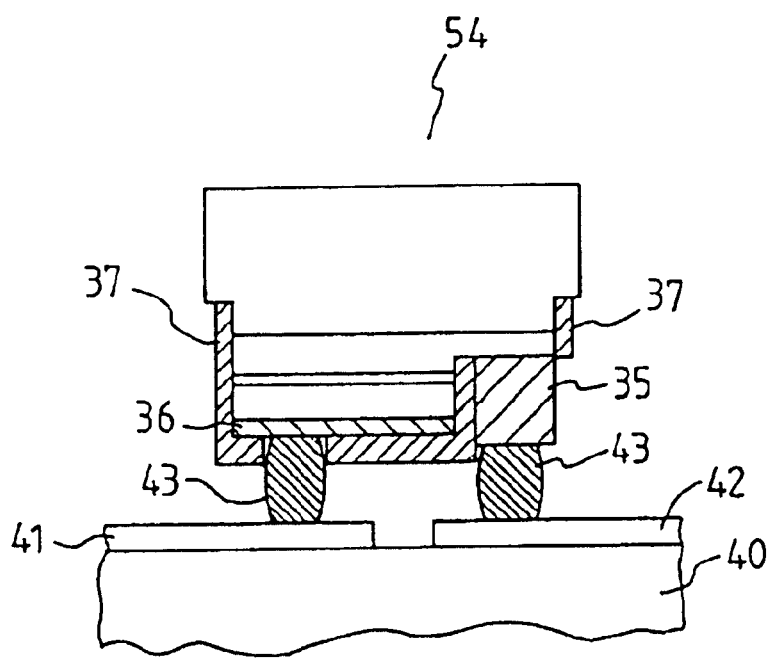
FIG. 4 is a schematic cross-sectional view of the light-emitting diode of FIG. 3 mounted on a base in the form of flip-chip.

FIG. 4 is a schematic view showing the light-emitting diode of FIG. 3 mounted on a base in the form of flip-chip. The base 40 can be a known conductive lead frame, a glass lead frame, a circuit board or a thin-film circuit. Using a conductive lead frame or a glass lead frame as the base, the final device will be a discrete light-emitting device, while using a circuit board or a thin-film circuit as the base, the light-emitting device will be in the form of surface mounted device (SMD). The base 40 has conductive portions 41 and 42 that function as a positive electrode and a negative electrode, respectively. Conductive glue 43 is applied by a machine on the positive and negative electrodes of the base 40. Then, the light-emitting diode 30 is turned over to let the transparent substrate be the top layer and the electrode 35 and 36 face down. After determining the correct polarities of the electrode 35 and 36, the electrodes 35 and 36 are connected to the conductive glue 43 so as to be fixed on the base and be coupled to the electrodes of the base. Finally, the conductive glue is baked in a suitable temperature during a predetermined time to complete the manufacture of the light-emitting device.

Figure 5:
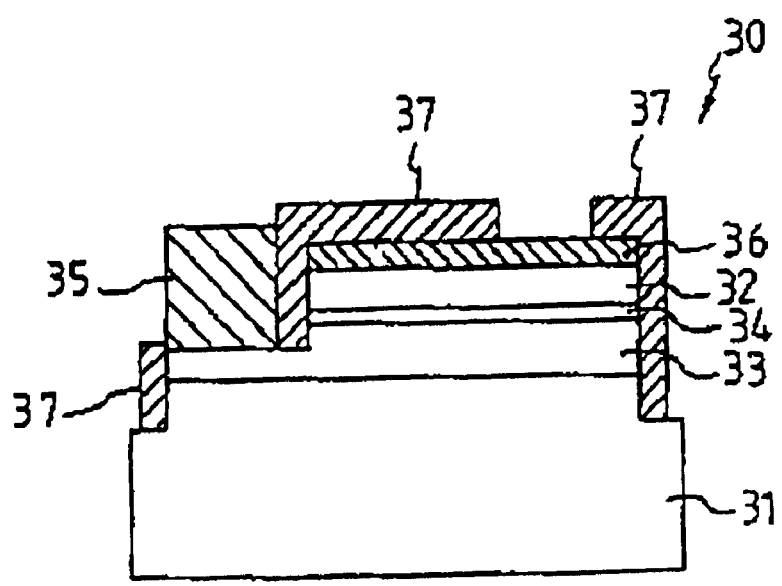
FIG. 5 is a schematic cross-sectional view illustrating a light-emitting diode according to a second embodiment of the present invention.

In this embodiment, about half of the light emitted from the p-n junction or the active layer of the light-emitting device will directly pass through the transparent substrate to the outside, while the other half of the light will direct to the electrode 36. Since the electrode 36 has high efficiency of reflectivity, it can reflect the light through the transparent substrate to the outside, and thus increase the light-emitting efficiency. Further, the electrode 36 provides the current spreading effect to additionally increase the light-emitting efficiency of the light-emitting diode In a second embodiment of the present invention as illustrated in FIG. 5, the places of the n-type semiconductor layer 32 and the p-type semiconductor layer 33 can be exchanged. In such an embodiment, the electrode 36 over the n-type semiconductor layer 32 may be of high reflectivity of light and may provide current spreading effect. Said electrode can be of a multi-layer structure comprising a light-transmitting conductive layer and a layer of aluminum (Al) or silver (Ag). In embodiments of the present invention, said electrode can be of a multi-layer structure of Ti/Al, Ti/Ag, ITO/Al or ITO/Ag.

The technical features and technical contents of the present invention have been fully disclosed as above. However, various modifications or replacements can be made by people skilled in the art based on the disclosure and teaching of the present invention without departing the spirit of the present invention. Therefore, the scope of the present invention shall not be limited to the above disclosed embodiments and should include said modifications and replacements.

What is claimed is:

1. A flip-chip light-emitting device, comprising:
   a transparent substrate comprising a main surface and a surface opposite to said main surface, wherein said surface opposite to said main surface is the light-emitting surface of said device;
   a semiconductor stacked structure arranged over said main surface of said transparent substrate wherein said stacked structure comprises an n-type GaN-based III-V Group compound semiconductor layer adjacent to said main surface and a p-type GaN-based III-V Group compound semiconductor layer adjacent to said n-type semiconductor layer;
   a first electrode being in electrical contact with said n-type semiconductor layer; and
   a second electrode being in electrical contact with said p-type semiconductor layer;

wherein said second electrode has good reflectivity of light, covers most of the outer surface of said p-type semiconductor layer and is positioned opposite to said light-emitting surface of said substrate.

2. The device of claim 1 wherein said stacked structure further comprises an active layer placed between said n-type semiconductor layer and said p-type semiconductor layer.

3. The device of claim 1 or 2 further comprising an insulating layer at least coated on the side surface of the stacked structure, a portion of said first electrode and a portion of said second electrode.

4. The device of claim 1 or 2 further comprising a base which has a first and a second conductive portions respectively connected to said first and second electrodes.

5. The device of claim 4 wherein said base can be a conductive lead frame, a glass lead frame, a circuit board or a thin-film circuit.

6. The device of claim 1 or 2 wherein said second electrode is a multi-layer structure comprising a light-transmitting conductive layer and a layer of aluminum (Al) or silver (Ag).

7. The device of claim 1 or 2 wherein said second electrode is a multi-layer structure of nickel/gold/titanium/aluminum (Ni/Au/Ti/Al), Indium-Tin Oxide/aluminum (ITO/Al) or Indium-Tin Oxide/silver (ITO/Ag).

8. A flip-chip light-emitting device, comprising:
   a transparent substrate comprising a main surface and a surface opposite to said main surface, wherein said surface opposite to said main surface is the light-emitting surface of said device;
   a semiconductor stacked structure arranged over said main surface of said transparent substrate wherein said stacked structure comprises a p-type GaN-based III-V Group compound semiconductor layer adjacent to said main surface and a n-type GaN-based III-V Group compound semiconductor layer adjacent to said p-type semiconductor layer;
   a first electrode being in electrical contact with said n-type semiconductor layer; and
   a second electrode being in electrical contact with said p-type semiconductor layer;
      wherein said first electrode has good reflectivity of light, and covers most of the outer surface of said n-type semiconductor layer and is positioned opposite to said light-emitting surface of said substrate.

9. The device of claim 8 wherein said stacked structure further comprises an active layer placed between said n-type semiconductor layer said the p-type semiconductor layer.

10. The device of claim 8 or further comprising an insulating layer at least coated on the side surface of the stacked structure, a portion of said first electrode and a portion of said second electrode.

11. The device of claim 8 or 9 further comprising a base which has a first and a second conductive portions respectively connected to said first and second electrodes.

12. The device of claim 11 wherein said base can be a conductive lead frame, a glass lead frame, a circuit board or a thin-film circuit.

13. The device of claim 8 or 9 wherein said second electrode is a multi-layer structure comprising a light-transmitting conductive layer and a layer of aluminum (Al) or silver (Ag).

14. The device of claim 8 or 9 wherein said second electrode is a multi-layer structure of titanium/aluminum (Ti/Al), titanium/silver (Ti/Ag), Indium-Tin Oxide/Aluminum (ITO/Al) or Indium-Tin Oxide/silver (ITO/Ag).

* * * * *